United States Patent [19]

Remy

[11] Patent Number: 4,458,329

[45] Date of Patent: Jul. 3, 1984

[54] FREQUENCY SYNTHESIZER INCLUDING A FRACTIONAL MULTIPLIER

[75] Inventor: Joël Remy, Paris, France

[73] Assignee: Adret Electronique, France

[21] Appl. No.: 326,773

[22] Filed: Dec. 2, 1981

[30] Foreign Application Priority Data

Dec. 31, 1980 [FR] France .................. 80 27872

[51] Int. Cl.³ .............................. G06G 7/26
[52] U.S. Cl. ................... 364/851; 307/529; 328/14; 331/2; 364/703; 364/841
[58] Field of Search .............. 364/851, 701, 703, 841; 328/14, 15, 155; 307/262, 529; 331/1 R, 1 A, 2, 10-12, 18, 19, 25, 37-44, 46-56

[56] References Cited

U.S. PATENT DOCUMENTS

| | | | |
|---|---|---|---|
| 3,319,178 | 5/1967 | Broadhead, Jr. | 331/2 |
| 3,427,561 | 2/1969 | Hamer | 331/19 |
| 3,694,766 | 9/1972 | Boelke | 331/19 X |
| 4,086,544 | 4/1978 | Fried | 331/2 X |
| 4,225,829 | 9/1980 | Kumagai | 331/2 X |
| 4,234,929 | 11/1980 | Riley, Jr. | 364/701 |
| 4,320,355 | 3/1982 | Kawagoe et al. | 331/2 |

Primary Examiner—Joseph F. Ruggiero
Attorney, Agent, or Firm—William A. Drucker

[57] ABSTRACT

A synthesizer comprises a basic synthesizer (1) generating a frequency $Fo+\xi$, wherein $\xi$ can be varied by small incremental steps, and a phase-locking loop (including a divider 2, a comparator 3, a filter 6, a mixer 4) setting the frequency of an intermediate oscillator (5) to a value $Fi=(Fo+\xi)/(NR+M)$, wherein $NR+M$ is the division rate of divider 2. A fractional multiplier including an output oscillator 8, a mixer 9, harmonic generators 7 to 12, a divider 13 and a phase comparator 11 multiplies intermediate oscillator frequency Fi by $N+(M/R)$, wherein R preferably is 5. The synthesizer can be used to synthesize frequencies up to several gigahertz.

7 Claims, 3 Drawing Figures

FREQUENCY SYNTHESIZER INCLUDING A FRACTIONAL MULTIPLIER

BACKGROUND OF THE INVENTION

The invention relates to generation of a variable frequency and more particularly to a frequency F comprising an integral multiple PN of a great frequency incremental step P and an increment including a component which can vary by small incremental steps $\xi$ and, if desired, a carrier frequency Fo which can in turn be in the form $N_1 P$,, wherein both N and $N_1$ are integers. A major application of the invention lies in frequency synthesizers for generating high frequencies.

The problem arising from synthesis of such a frequency is particularly difficult to solve in case of high frequencies, e.g. up to several gigahertz.

THE PRIOR ART

Indeed, the heretofore known solutions for generating a frequency of the above PN type generally consist in controlling an oscillator frequency by means of a phase-locking loop including either a frequency N—divider or means for comparing the oscillator frequency with the Nth harmonic of a reference frequency P. Whenever N has a high value (which occurs whenever, even with relatively low frequencies, P is reduced to achieve a high resolution), the "phase noise" Z resulting from the loop components is multiplied by N at the oscillator output, so that the spectral purity of the produced signal becomes poor.

Finally, said solutions become further complicated whenever an increment is to be introduced in addition to the PN component.

It is known, e.g. from French Pat. No. 1 145 233, to effect the summation of a frequency $Fo + \xi$ and of a frequency in the NP form by means of an oscillator controlled through a phase loop. Such a solution uses an oscillator to generate great incremental steps NP and a further oscillator to effect said summation and results in relatively complex circuits.

It has also been proposed, in applicant's French Pat. No. 2 143 558 filed on June 29, 1971 and entitled. "A frequency synthesizer having multiple controlling loops," to generate a frequency of the above-mentioned type by means of a circuitry comprising a first oscillator controlled so as to generate said integral multiple, a second oscillator and means using the control frequency which controls the first oscillator frequency to impose upon the second oscillator a frequency shifted therefrom by a value broadly equal to said increment.

Preferably, to each oscillator are associated a first phase-locking loop for providing a frequency approximately equal to the desired frequency and provided with a presettable frequency divider, a second, fine-controlling loop including no frequency divider, wherein said first loop becomes inoperative as soon as said second loop becomes operative and, if desired, a third loop for eliminating any remaining noise, which constantly sets to zero the output voltage from the phase comparator of the second loop.

It has further been proposed, in applicant's French Pat. No. 2 230 117 filed on May 16, 1973, a circuitry even simpler than the preceding one, which comprises a basic synthesizer adapted to generate a first frequency $(Fo + \xi)$ and an additional circuitry connected to the output of said basic synthesizer and adapted to provide additional incremental steps P, said additional circuitry comprising means for dividing said first frequency $(Fo + \xi)$ by a variable integer (N) and to add said additional incremental step, and means for multiplying the result $$Fi = \frac{P(Fo + \xi)}{N}$$

by said integer N, said additional circuitry comprising a phase-locking loop which in turn includes a divider which can be pre-set to said N value, said divider connecting said basic synthesizer output to one input of a phase comparator, a variable oscillator the frequency of which is controlled by the output of said phase comparator, and means for applying to the other input of the phase comparator the beat frequency equal to the difference between the oscillator output frequency and a standard frequency equal to P.

The multiplication by N of the intermediate frequency Fi is preferably carried out by means of a second phase-locking loop including a second variable oscillator the frequency of which is controlled by the output of a second phase comparator, one input of which is supplied with said intermediate frequency and the other input of which is supplied with the output of said second variable oscillator, after its frequency has been divided by N in a second presettable divider.

The major limitation of such a device resides in the fact that the number N of great incremental steps P which it can generate is as smaller as the desired spectral quality for the output signal is higher. Indeed, the phase noise and parasitic spectral lines which may affect purity of the output signal from the first oscillator are both multiplied by N in said second loop.

OBJECTS OF THE INVENTION

The purpose of the present invention is to multiply by an integer R the number N of steps which a device of the above-mentioned kind can provide along with a good spectral purity.

SUMMARY OF THE INVENTION

For this purpose, in the circuitry in accordance with the invention, said first frequency $(Fo + \xi)$ is divided by a rate $NR + M$, wherein N, R and M are integers, whereas said intermediate frequency Fi is multiplied by the fractional number $NNR + M/R)$.

Under such conditions, the output frequency Fs comprises, in addition to the component NP representing the great incremental steps, a component $(MP/R)$ which introduces M incremental steps the value of each is $(P/R,)$ and a component $(Fo + \xi/R)$ corresponding to the result of the division by R of each small incremental step $Fo + \xi$.

In a practical embodiment, said second phase-locking loop which carries out said fractional multiplication includes a frequency N-multiplier which is connected to the output of the first loop oscillator, followed by a sampling "mixer" which is also supplied with the output of the second loop oscillator, and a frequency R-divider followed by a M-multiplier and an additional phase comparator which is also supplied with the output frequency of said sampling mixer and the output of which is connected to a frequency control input of said second oscillator.

In a preferred embodiment wherein the value of the incremental step P is 10 MHz, the number R is chosen equal to 5 and the division rate NR+M is calculated by subtracting the value Fo/5 from the frequency to be synthesized, and then dividing by 2 the subtraction result.

As this will be further explained herein after, the invention can be used to achieve in a simpler manner a synthesizer adapted to operate at frequencies up to several gigahertz, with a particularly high spectral purity.

BRIEF DESCRIPTION OF THE DRAWING

The invention will be better understood by means of the following description thereof.

In the appended drawings.

DESCRIPTION OF THE PREFERRED EMBODIMENT

Figure 1:
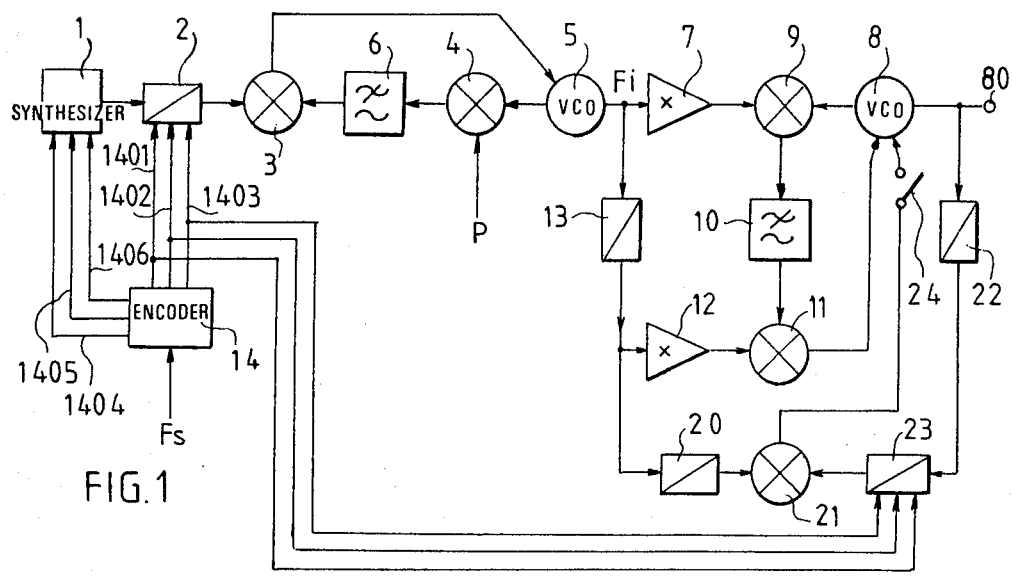
FIG. 1 is a functional diagram showing a frequency synthesizer in accordance with the preferred embodiment of the invention.

As shown in FIG. 1, the device comprises a basic synthesizer 1 adapted to generate a first frequency Fo+ξ, followed by a frequency divider 2 the division rate of which is equal to NR+M wherein N, R and M are integers, R is a fixed number, the rate NR+M can be pre-set and M may assume positive, negative or null integral values within a range which will be defined hereinafter.

Divider 2 is in turn followed by a phase comparator 3 which is also supplied with the beat frequency, obtained in a mixer 4, from the difference between the output frequency Fi of a voltage-controlled oscillator 5 and a standard frequency P. Said beat frequency is filtered by a pass-band filter 6 before being applied to phase comparator 3. The output of the latter is applied to the frequency control input of oscillator 5.

It should be understood that the frequency of oscillator 5 will be dependent upon a value Fi such that the beat frequency Fi−P will be equal to (Fo+ξ/NR+M), from which it results that $$Fi = \frac{Fo + \xi}{NR + M} + P. \quad (1)$$

In the above calculations, it has been assumed for convenience that Fi>P.

From the intermediate frequency Fi, a first frequency multiplier 7 generates a frequency comb extending over the whole range of output frequencies desired for the circuitry and collected at the output 80 of a voltage-controlled oscillator 8. The beat resulting in a sampling mixer 9 from the difference between said output frequency Fs and the nearest harmonic contained in said comb is filtered in a low-pass filter 10 and applied to a phase comparator 11 to which is also applied a second frequency comb generated by a second multiplier 12. The ouptut of the phase comparator 11 is connected to one frequency control input of oscillator 8.

Multiplier 12 is supplied with frequency Fi after the latter has been divided by R in a frequency divider 13.

Once the controlling loop which controls the frequency of oscillator 8 has been stabilized, the relation $$N Fi - Fs = (MFi/R)$$

is of course verified, and it results therefrom that $$Fs = Fi \frac{NR + M}{R} \quad (2)$$

wherein N is the harmonic rank of the comb spectral line emitted by multiplier 7 and M is the harmonic rank of the comb spectral line emitted by multiplier 12 for which the beat frequency emitted by comparator 11 is equal to the frequency of the harmonic component generated by multiplier 12.

By substituting in relation (2) Fi as derived from relation (1), there is obtained, provided that M and N values are the same in both relations:

$$Fs = \frac{Fo + \xi}{R} + NP + \frac{MP}{R} \quad (3)$$

Practically speaking, when P is an incremental step of e.g. 10 MHz, the increment ξ will vary from 0 to 10 MHz and Fo will advantageously be a multiple of P or P/R.

In a preferred embodiment, R will be chosen equal to R=5.

Let us now assume that Fo=20 MHz. The frequency provided by synthesizer 1 will then vary from 20 to 30 MHz, and the output frequency will comprise a carrier frequency (Fo/R)=4 MHz, a first increment ξ/R variable from 0 to 2 MHz, a second increment including N incremental steps of 10 MHz and a third increment including M incremental steps each having a value P/R=2 MHz.

Figure 2:
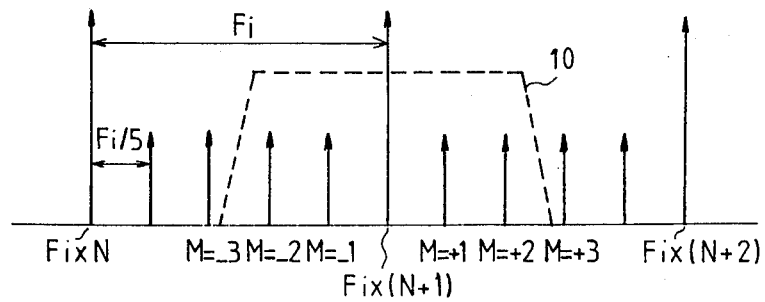
FIG. 2 shows the spectrum of the frequencies involved in the control loop of the output oscillator of said synthesizer.

In FIG. 2 are shown the successive harmonic components Fi.N, Fi (N+1), Fi (N+2) of the frequency comb produced by multiplier 7, in the form of vertical vectors. The beat resulting from the frequency difference between output frequency Fs and the frequencies of said comb is equal to M(Fi/2), i.e., when R=5, frequency Fs is represented by vertical vectors respectively located on the left and right sides of a given harmonic component (e.g., Fi (N−1)), at distances M=−1, M=−2, M=−3 and M=+1, M=+2, M=+3 from said harmonic components.

Practically speaking, if it is desired that Fs will extend over the whole frequency range through incremental steps of 2 MHz, e.g. between 100 and 200 MHz, then N must be varied between 10 and 20 and, since (ξ/R) is the difference between Fs and the nearest multiple of 2 MHz, the value (Fo/R)+(MP/R) which corresponds to Fs−NP−(ξ/R) will be a multiple of 2 MHz between 0 and 8, i.e. M can become equal to −2, −1, 0, +1 and +2.

In case where M=0, mixer 9 supplies a beat equal to zero, i.e. a continuous voltage which varies with the phase of frequency Fs and is sampled in comparator 11, i.e. is merely duplicated.

By subtracting from Fs the increment ξ/R lower than 2 MHz, the remainder Fs−ξ/R may be written:

(Fo/R)+(NR+M) (P/R), or, with the above values, 4 MHz+2(NR+M). In other words, the division rate NR+M of divider 2 is obtained by further subtracting 4 MHZ from said remainder and by dividing the subtraction result by 2. Such a result is achieved by means of a calculating and encoding device 14 which carries out the following operations from the value of frequency Fs which is to be synthesized: substracting Fo/R, i.e., 4 MHz in the present case, dividing by (P/P), i.e., by 2 in the present case; the result provides the division rate; device 14 generates from said rate the codes required for pre-setting divider 2 (see lines 1401, 1402, 1403 in FIG. 1), from the remainder of the division, which represents the increment ξ, generating the codes required for presetting basic generator 1 (see lines 1404, 1405 and 1406 in FIG. 1).

Calculating and encoding device 14 can easily be designed by men skilled in the art.

Some numerical examples of the invention will now be given by way of illustration only:

For Fs=100 MHz, NR+M=(96/2)=48 and ξ=0; by choosing N=10, there results M=−2

For Fs 200 MHz, then NR+M=(196/2)=98. by by choosing N=20, there results M=−2.

For any intermediate value, say e.g. $F_S$=123.567 MHz, N will be chosen equal to 12 and (ξ/R) equal to 1.567, from which it will result NR+M=(122−4/2)=59 and hence M=−<1.

The frequency at the input of comparator 3 will be: 20 MHz+5 (1.567 MHz)/59=0.4718 MHz, from which it results Fi=10.4718 MHz. At the output of multiplier 7, the twelfth harmonic component of Fi will be caused to beat, i.e. the beat frequency will be 125.6614 MHz with Fo=123.567 MHz, or a subtractive beat of 2.0944 MHz. This beat will be compared in phase comparator 11 to (Fi/5)·M=2.0944 MHz.

Turning now again to FIG. 2, it will be appreciated that filter 10 must have a pass-band (shown in broken line) such that the beat frequencies corresponding to M=±2 will be transmitted whereas the beat frequencies corresponding to M=±3 will be filtered out. It results therefrom that the filtering problem can easily be solved in the presently considered case where R=5. If R were chosen equal to 3.7 or 9, and the like, the filtering problem would be also easily solved since for any odd value of R the situation would be substantially the same as in FIG. 2, and the frequency line Fi.N+2 Fi/5 and the frequency line Fi.(N+1)−(2Fi/5) would play symmetrical roles with respect to frequency Fi·N+(Fi/2).

However, it can be shown that the logic encoding which enables setting the division rate of divider 2 is more complicated to achieve for odd values of R other than 5. The value of R=5 is therefore the preferred embodiment of the invention.

For even values of R such as 8 or 10, the above-described device can operate in the above-described manner except whenever the desired frequency corresponds to a controlling point located at equal distances from two comb successive frequencies Fi.N . . . Fi.(N+1), etc.

Figure 3:
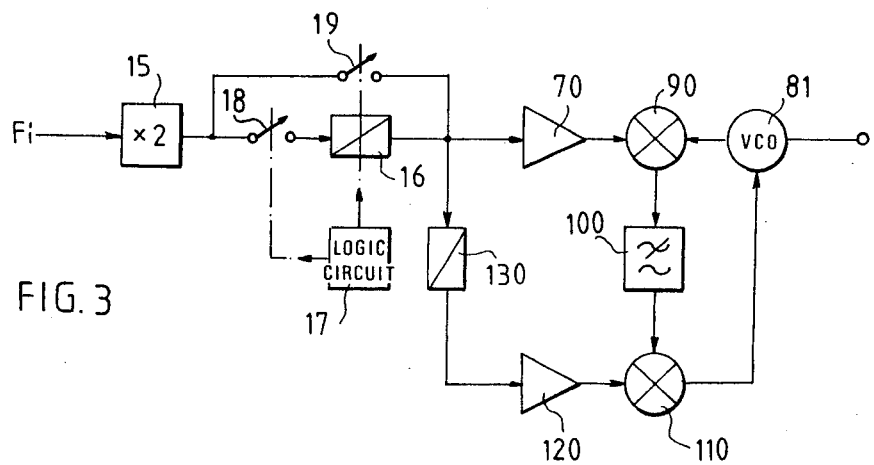
FIG. 3 is a view of the output stage of a synthesizer circuitry in accordance with a modified embodiment of the invention.

In such an instance, e.g. for R=10, the frequency Fi·N+5 Fi/10 is coincident with the frequency Fi (N+1)−5 Fi/10 and it is impossible to separate these two frequencies through filtering. In order to solve such a problem, the circuit illustrated in FIG. 3 will be used as the final stage of the circuitry connected to the output of oscillator 5 of FIG. 1. The principle of the circuit of FIG. 3 is the same as the principle of the circuit shown in FIG. 4 of applicant's French Pat. No. 2,305,888 filed on Mar. 27, 1975 and entitled: "A frequency-settable signal generator including a phase lock oscillator."

The input frequency Fi from oscillator 5 of FIG. 1, after it has been multiplied by 2 in a device 15, is normally applied to a 2-divider 16 followed by the above-described circuitry, namely a N-multiplier 70 driving a sampling mixer 90 which in turn is also driven by an output oscillator 81; a R-divider 130 followed by a M-multiplier 120 the output of which drives a phase comparator 11. The output of mixer 90 drives, via a filter 100, another input of comparator 110 the output of which controls the frequency of oscillator 81.

The above-described circuitry operates, for $F_S$ values which do not correspond to M=5, like the circuitry of FIG. 1.

Only for $F_S$ values corresponding to M=5, a logic circuit 17 opens a normally closed switch 18 and closes a normally open switch 19. It results therefrom that a frequency equal to 2 Fi is transmitted directly to the inputs of multiplier 70 and of divider 130, respectively. The frequency comb derived from multiplier 70 then includes frequencies equal to 2 Fi, 4 Fi, 6 Fi, etc. and the filtering problem becomes easy to solve.

It should be emphasized that both the circuitry of FIG. 1 and the circuitry which includes the output stage of FIG. 3 can operate only if the frequency of the output oscillator (8 and 81, respectively) has previously been set to a value near Fs, so that the controlling function can be used.

Such an approximation towards the frequency of the output oscillator can be achieved in various ways. For output frequencies in the range of several gigahertz, the frequency of the output oscillator can be pre-set by analogic means. For lower frequencies, there will advantageously be used a digital approximation loop such as disclosed in applicant's French Patent No. 1 585 829 filed on Oct. 17, 1968 and entitled: "A variable frequency, electrical signal generator circuitry including three controlling loops."

In FIG. 1 is shown a particularly simple digital approximation loop comprising a P-divider 20 connected to the output of divider 13 and driving one input of a phase comparator 21, a P-divider 22 connected to the output of oscillator 8 and followed by a (NR+M) divider 23 which is pre-set through device 14 and drives another input of comparator 21. The approximation loop can be cut off through a switch 24 as soon as the frequency approximation is completed, i.e. when:

$$Fs/P\,(NR+M)=Fi/RP$$

from which it results $$Fs=Fi\cdot(NR+M/R)$$

It will be noted that all the frequencies involved in the loop controlling the output oscillator 8 are fractional sub-multiples of the frequencies of said oscillator. It results therefrom that there will never be coincidence or quasi-coincidence between an harmonic component of such frequencies and said output frequency and that no low frequency beat likely to affect the spectral purity of the emitted signal can be generated in such a circuitry.

It should be understood that various changes can be made in the above-described and shown circuitries without departing from the scope of the invention.

We claim:

1. A device for generating a variable frequency comprising an integral multiple PN of a great frequency incremental step P and an increment which in turn comprises a component which can vary by small incremental steps ξ and a carrier frequency Fo, in which said increment is generated by a frequency synthesizer, said device including a pre-settable first frequency divider connected to the output of said frequency synthesizer, a first phase comparator, a first input of which is connected to the output of said first frequency divider and the output of which is connected to the frequency control input of a first voltage-controlled oscillator, a subtractive mixer which is supplied both with a standard frequency equal to said incremental steps P and with the output frequency of said first oscillator, a pass-band filter connecting the output of said subtractive mixer to a second input of said first phase comparator, and means for multiplying an intermediate frequency Fi generated by said first oscillator by a factor having an integral component equal to N, characterized in that said factor of multiplication of said intermediate frequency includes a fractional component in the form (M/R) and the division rate of said first frequency divider is in the form NR'M wherein R is a predetermined integer.

2. A device according to claim 1, characterized by means for calculating the division rate NR+M which corresponds to any given output frequency of the device, said calculating means comprising means for algebraically adding to said output frequency the ratio (Fo/R) of said carrier frequency to said predetermined integer, and means for dividing the result of such an operation by the ratio (P/R) of said great incremental step to said predetermined integer, the integral component of the result of the division being said division rate and the difference between the dividend and the product of said integral component times said ratio (P/R) defining said increment.

3. A device according to claim 1, characterized in that said predetermined integer R is an odd number.

4. A device according to claim 3, characterized in that said predetermined integer R is 5.

5. A device according to claim 1, characterized in that said means for multiplying intermediate frequency Fi includes: a first harmonic generator multiplying the intermediate frequency by N, followed by a sampling mixer which is also supplied with the output of a second voltage-controlled oscillator, a second frequency divider having a division rate R, followed by harmonic generator for multiplying frequency (Fi/R) by M, and a second phase comparator supplied with the output from said second harmonic generator and with the beat frequency from said sampling mixer, the output of said second phase comparator being connected to the frequency control input of said second oscillator.

6. A device according to claim 5, characterized by a loop for approximating the frequency of said second oscillator, including a third frequency divider having a division rate P which is connected to the output of said second oscillator, followed by a fourth frequency divider having a division rate NR+M, a third phase comparator one input of which is connected to the output of said fourth frequency divider and the output of which is connected to another frequency control input of said second oscillator through a switch, and a fifth frequency divider having a division rate R which connects the output of said second frequency divider to another input of said third phase comparator.

7. A device according to any one of claims 1, 2, 5 or 6, characterized in that, in the case where said predetermined integer R is an even number, said intermediate frequency will be multiplied by 2 for all the values of the output frequency for which the component which represents the fraction (M/R) Fi of said intermediate frequency would correspond to (Fi/2).

* * * * *